(12) United States Patent
Rasheed et al.

(10) Patent No.: US 11,098,611 B2
(45) Date of Patent: Aug. 24, 2021

(54) MECHANICAL CALIBRATION OF TURBINE OVER SPEED TRIP

(71) Applicant: Saudi Arabian Oil Company, Dhahran (SA)

(72) Inventors: Hussain H. Rasheed, Al Hofuf (SA); Abdulkareem A. Alturki, Riyadh (SA)

(73) Assignee: Saudi Arabian Oil Company, Dhahran (SA)

(*) Notice: Subject to any disclaimer, the term of this patent is extended or adjusted under 35 U.S.C. 154(b) by 304 days.

(21) Appl. No.: 16/256,667

(22) Filed: Jan. 24, 2019

(65) Prior Publication Data

US 2020/0240288 A1   Jul. 30, 2020

(51) Int. Cl.
| | |
|---|---|
| F01D 21/16 | (2006.01) |
| F01D 21/00 | (2006.01) |
| F01D 21/02 | (2006.01) |
| G01H 1/00 | (2006.01) |
| G01H 1/08 | (2006.01) |

(52) U.S. Cl.
CPC ........... *F01D 21/16* (2013.01); *F01D 21/003* (2013.01); *F01D 21/02* (2013.01); *F05D 2270/021* (2013.01); *G01H 1/006* (2013.01); *G01H 1/08* (2013.01)

(58) Field of Classification Search
CPC ........ F01D 21/16; F01D 21/003; F01D 21/02; F05D 2270/021; G01H 1/006; G01H 1/08; G01R 31/343; H01H 35/10
See application file for complete search history.

(56) References Cited

U.S. PATENT DOCUMENTS

| 2,999,139 | A | * | 9/1961 | Lee | .......... | H01H 35/10 |
| | | | | | | 200/80 B |
| 4,689,452 | A | * | 8/1987 | Quick | .......... | H01H 35/10 |
| | | | | | | 200/80 R |
| 4,812,602 | A | * | 3/1989 | Plangger | .......... | F01D 21/02 |
| | | | | | | 200/80 R |

(Continued)

FOREIGN PATENT DOCUMENTS

| CN | 102298113 | 7/2013 |
| CN | 106289798 | 1/2017 |

(Continued)

OTHER PUBLICATIONS

International Search Report and Written Opinion issued in International Application No. PCT/US2020/014790 dated Apr. 17, 2020, 16 pages.

(Continued)

*Primary Examiner* — Freddie Kirkland, III
(74) *Attorney, Agent, or Firm* — Fish & Richardson P.C.

(57) ABSTRACT

Techniques for mechanical calibration of turbine overspeed trip are described. An electric motor rotates a rotational electric motor shaft coupled to an over speed trip collar of a rotational shaft of an electric machine at multiple rotational speeds. The over speed trip collar is configured to trip in response to the rotational electric motor shaft being rotated at a particular rotational speed. The over speed trip collar triggers an alarm when a rotational speed of the multiple rotational speeds substantially matches the particular rotational speed. The alarm provides a signal in response to triggering the alarm.

20 Claims, 5 Drawing Sheets

(56) References Cited

U.S. PATENT DOCUMENTS

| | | | | |
|---|---|---|---|---|
| 8,661,880 B2* | 3/2014 | Block | ............... | F01D 21/20 |
| | | | | 73/112.01 |
| 9,031,806 B2* | 5/2015 | Nunley | ............... | B66B 5/04 |
| | | | | 702/113 |
| 10,054,004 B2* | 8/2018 | Revak | ............... | F01D 21/003 |
| | | | | 702/33 |
| 10,690,002 B2* | 6/2020 | Revak | ............... | 702/33 |
| 10,690,003 B2* | 6/2020 | Revak | ............... | F01D 21/02 |
| | | | | 702/33 |
| 2012/0143555 A1* | 6/2012 | Nunley | ............... | B66B 5/04 |
| | | | | 702/113 |
| 2015/0204211 A1* | 7/2015 | Revak | ............... | F01D 21/02 |
| | | | | 702/33 |
| 2018/0328222 A1* | 11/2018 | Revak | ............... | F01D 21/20 |
| | | | | 702/33 |
| 2018/0328223 A1* | 11/2018 | Revak | ............... | F01D 17/06 |
| | | | | 702/33 |

FOREIGN PATENT DOCUMENTS

| | | |
|---|---|---|
| CN | 106370409 | 2/2017 |
| CN | 107024240 | 8/2017 |
| CN | 108412559 | 8/2018 |
| DE | 3120302 | 12/1982 |
| DE | 3713353 | 11/1988 |

OTHER PUBLICATIONS

Taylor et al., "Turbine Overspeed Systems and Required Response Times," Proceedings of the 38th Turbomachinery Symposium, Dec. 31, 2009, 12 pages.

* cited by examiner

MECHANICAL CALIBRATION OF TURBINE OVER SPEED TRIP

TECHNICAL FIELD

This disclosure relates to calibrating rotary mechanical & electrical machines, for example, rotary mechanical machines such as turbines.

BACKGROUND

Certain mechanical & electric machines, for example, motors, generators, turbines, include rotating shafts that either rotate to produce electrical energy or rotate in response to receiving electrical energy. Power associated with such electric machines is based, in part, on the rotational speeds of the shafts. Because the rotational speeds of the shafts are high (for example, several thousands of rotations per minute), centrifugal forces generated by the rotating shafts are correspondingly high. One instance of an over speed failure of a rotary mechanical & electric machine is when the rotational speed of the shaft exceeds predetermined speed limits. For a turbine, for example, over speed failure can result in the centrifugal force pulling apart the main shaft and turbine wheels and, in some extreme cases, can result in the turbine housing disintegrating and flinging moving shards of metal in all directions. Rotary mechanical & electric machines can be equipped with shutoff mechanisms that automatically stop the electric machines upon experiencing over speed, that is, an increase in the rotational speed of the rotary shaft beyond a threshold speed limit.

SUMMARY

This disclosure describes technologies directed to mechanical calibration of turbine over speed trip.

Certain aspects of the subject matter described here can be implemented as a method. An over speed trip collar of a rotational shaft of an electric machine is coupled to a rotational electric motor shaft. The over speed trip collar is configured to trip in response to the rotational shaft of the electric machine being rotated at a particular rotational speed. The rotational electric motor shaft is variable rotated at multiple rotational speeds. It is determined that the over speed trip collar trips at a rotational speed of the multiple rotational speeds. It is determined that the rotational speed of the multiple rotational speeds at which the over speed trip collar trips is the particular rotational speed at which the over speed trip collar is configured to trip when implemented with the rotational shaft of the electric machine.

An aspect combinable with any of the other aspects can include the following features. To rotationally couple the over speed trip collar to the rotational electric motor shaft, an end of the rotational electric motor shaft is rotationally coupled to a first hub assembly. The first hub assembly is rotationally coupled to a second hub assembly. An end of the second hub assembly is rotationally coupled to the over speed trip collar.

An aspect combinable with any of the other aspects can include the following features. The second hub assembly includes a rotational shaft of the second hub assembly. To rotationally couple the end of the second hub assembly to the over speed trip collar, an end of the rotational shaft of the second hub assembly is coupled to the over speed trip collar.

An aspect combinable with any of the other aspects can include the following features. To rotationally couple the end of the rotational shaft of the second hub assembly to the over speed trip collar, the end of the rotational shaft of the second hub assembly is inserted into the over speed trip collar.

An aspect combinable with any of the other aspects can include the following features. The rotational electric motor shaft is variably rotated using a variable frequency drive (VFD) coupled to and configured to operate the rotational electric motor shaft.

The over speed trip collar includes a trigger pin configured to extend radially away from a rotational axis of the rotational electric motor shaft in response to the rotational electric motor shaft rotating at the particular rotational speed. To determine the rotational speed of the multiple rotational speeds at which the over speed trip collar trips, an alarm is spatially positioned relative to the trigger pin. The trigger pin is configured to trigger the alarm in response to the trigger pin extending radially away from the rotational axis of the rotational electric motor shaft. It is detected that the alarm has been triggered.

An aspect combinable with any of the other aspects can include the following features. The trigger pin is configured to contact the alarm in response to extending radially away from the rotational axis of the rotational shaft of the electric machine. To detect that the alarm has been triggered, an audible sound emitted by the alarm in response to being contacted by the trigger pin is detected.

An aspect combinable with any of the other aspects can include the following features. In response to determining the rotational speed of the multiple rotational speeds, the particular rotational speed at which the over speed trip collar is configured to trip is modified by modifying one or more structural parameters of the over speed trip collar.

An aspect combinable with any of the other aspects can include the following features. The over speed trip collar is detached from the electric machine before rotationally coupling the over speed trip collar of the rotational shaft of the electric machine to the rotational electric motor shaft.

An aspect combinable with any of the other aspects can include the following features. The electric machine is a turbine.

Certain aspects of the subject matter described here can be implemented as a method. An electric motor rotates a rotational electric motor shaft coupled to an over speed trip collar of a rotational shaft of an electric machine at multiple rotational speeds. The over speed trip collar is configured to trip in response to the rotational electric motor shaft being rotated at a particular rotational speed. The over speed trip collar triggers an alarm when a rotational speed of the multiple rotational speeds substantially matches the particular rotational speed. The alarm provides a signal in response to triggering the alarm.

An aspect combinable with any of the other aspects can include the following features. The alarm is spatially positioned relative to the over speed trip collar to be contacted by a trigger pin of the trip collar in response to the over speed trip collar tripping. The over speed trip collar triggers the alarm by the trigger pin contacting a plunger of the alarm.

An aspect combinable with any of the other aspects can include the following features. The signal is an audible signal generated in response to the trigger pin contacting the plunger of the alarm.

An aspect combinable with any of the other aspects can include the following features. The alarm includes a displacement sensor configured to sense a distance between the trigger pin and the displacement sensor. The displacement sensor determines that a distance between the trigger pin and the displacement sensor is less than a distance threshold.

An aspect combinable with any of the other aspects can include the following features. The signal is an audible signal generated by an audio source connected to the displacement sensor in response to determining that the distance is less than the distance threshold.

An aspect combinable with any of the other aspects can include the following features. The over speed trip collar is detached from the electric machine before rotationally coupling the over speed trip collar of the rotational shaft of the electric machine to the rotational electric motor shaft.

An aspect combinable with any of the other aspects can include the following features. The electric machine is a turbine.

Certain aspects of the subject matter described here can be implemented as an overtrip calibration system. An electric motor including a rotational electric motor shaft is configured to rotationally couple to an over speed trip collar of a rotational shaft of a turbine. The over speed trip collar is configured to trip in response to being rotated at or above a particular rotational speed. A controller is coupled to the rotational shaft. The controller is configured to variably rotate the rotational electric motor shaft at multiple rotational speeds including at or above the particular rotational speed. An alarm is spatially arranged relative to the over speed trip collar. The alarm is configured to produce a signal in response to the over speed trip collar tripping.

An aspect combinable with any of the other aspects can include the following features. The controller includes a variable frequency drive.

An aspect combinable with any of the other aspects can include the following features. The over speed trip collar includes a trigger pin configured to extend radially away from a rotational axis of the rotational electric motor shaft in response to the over speed trip collar tripping. The signal is an audible signal. The alarm is configured to produce the audible signal in response to the trigger pin extending radially away from the rotational axis of the rotational electric motor shaft and contacting the alarm.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
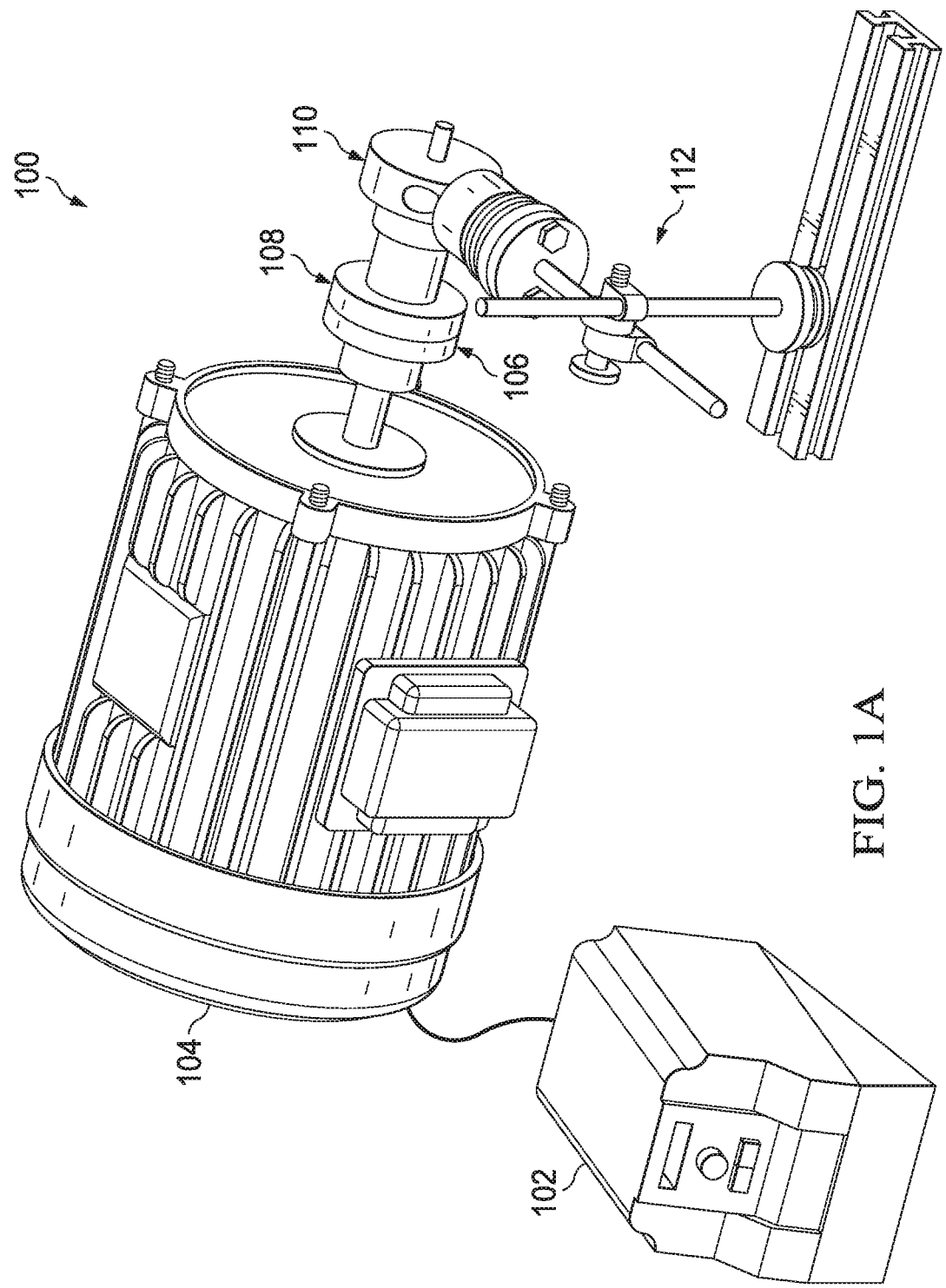
FIGS. 1A and 1B are schematic diagrams of an over speed trip calibration system for an over speed trip collar.

This disclosure describes a mechanical over speed trip calibration system. As used in this disclosure, the term "over speed" references a condition in which a rotational shaft rotates beyond a threshold rotational speed that represents a safety limit for the rotational shaft. Also, as used in this disclosure, the term "trip" references a stoppage of the rotational shaft in response to the rotational shaft exceeding allowable speed setting. In addition, as used in this disclosure, the term "trip speed" references a rotational speed of a rotational shaft at or above maximum allowable speed setting. Implementations of the disclosure are described with reference to a rotational shaft of a turbine. The disclosure can be implemented for rotational shafts of other mechanical & electric machines, for example, steam turbine, gas turbine, wind turbine, diesel engine, generators, motors, as well as for other non-machines with rotational shafts for which over speed limits need to be set.

An over speed trip calibration system that can be implemented for turbines includes a trip collar through which a rotational shaft of the turbine passes. The trip collar includes a trigger pin that can extend radially away from a rotational axis of the rotational shaft of the turbine. When a rotational speed of the shaft exceeds a pre-determined rotational speed, the centrifugal force on the trigger pin causes the pin to extend radially away from the rotational axis of the shaft. The radial extension causes the trip collar to trip and shuts off the turbine. As described later, the trip collar can be adjusted to vary the rotational speed at which the trigger pin extends causing the trip collar to trip.

One technique to determine the trip speed, that is, the rotational speed at which the trip collar trips, of the turbine involves operating the turbine at different rotational speeds until the trip collar trips. Also, the trip collar can be calibrated to trip at a desired rotational speed. Calibration of the trip collar can include modifying the trip speed if the turbine trips at a speed different from that desired. Modifying the trip speed includes the following steps—disassemble turbine, separate trip collar from rotational shaft, adjust the trip collar, re-attach trip collar to the rotational shaft and re-assemble turbine. Subsequently, a new trip speed of the turbine is determined. For each further adjustment of the trip speed, the steps to modify the trip speed are performed. A turbine and a trip collar have multiple components which can make disassembly and re-assembly resource (for example, time, man hours) intensive, not to mention the time to operate the turbine to determine the over speed trip.

This disclosure describes techniques to determine or modify (or both) the over speed of an over speed trip collar that is detached from a rotary electric machine in which the trip collar is disposed. By detaching the trip collar from the rotary mechanical & electric machine, the need to disassemble and re-assemble the rotary electric machine and the associated resources to do so can be avoided. The time to determine trip speed and to calibrate the trip collar can be reduced. In addition, the calibrated trip collar can be used as the over speed trip system in any rotary mechanical & electric machine to which the trip collar can be attached. Implementations of the techniques described in this disclosure can protect the turbine from exceeding maximum allowable operating speed during the operating test, by adjusting and presetting trip collar to required trip speed before installation, thereby ensuring that the turbine will not exceed this preset trip value. Such testing and calibration can be implemented without using turbine.

Figure 1B:
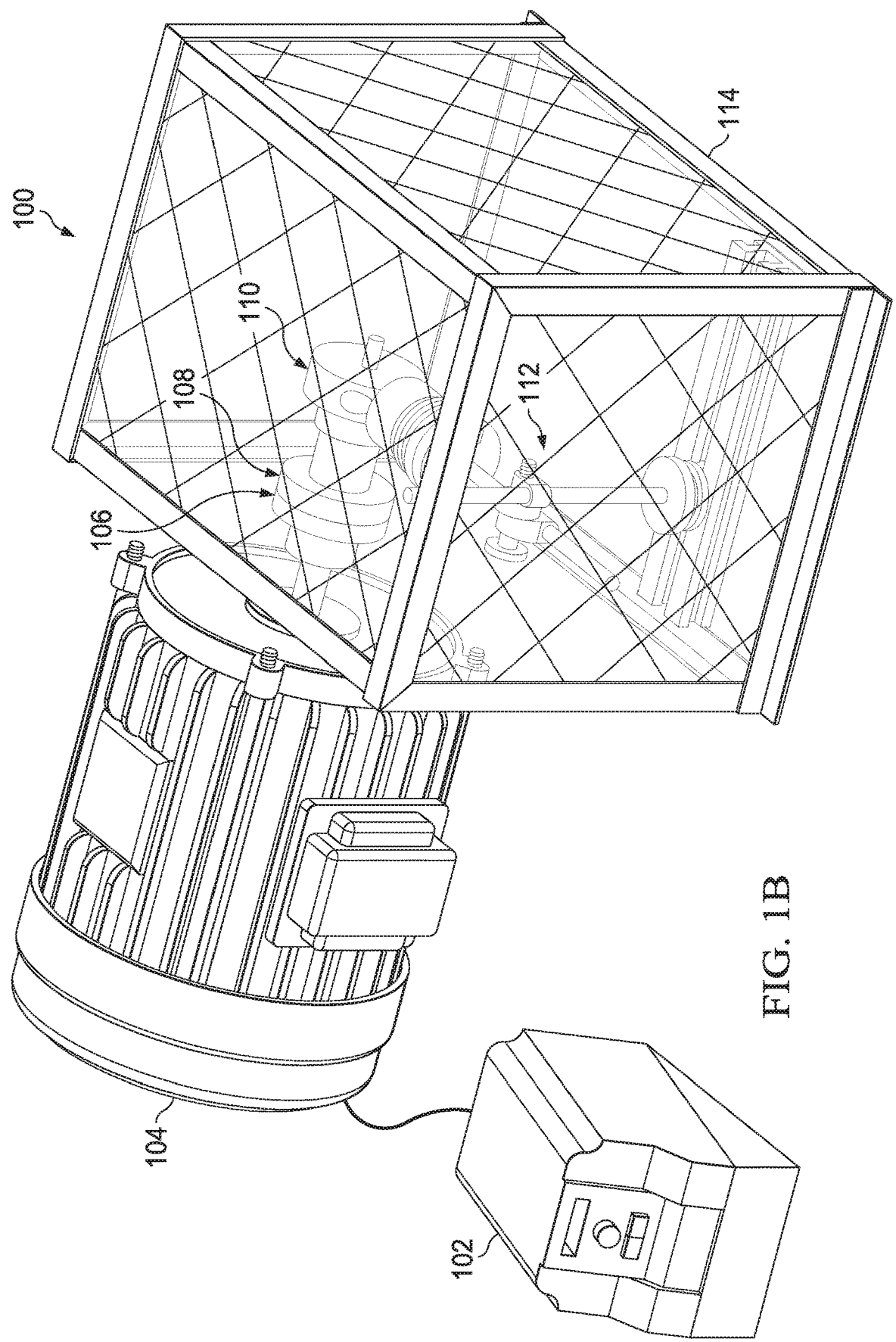

FIGS. 1A and 1B are schematic diagrams of an over speed trip calibration system 100 for an over speed trip collar. In some implementations, the system 100 is implemented to determine a trip speed associated with the trip collar, that is, a rotational speed at which the trip collar will trip. The system 100 includes a controller 102 coupled to an electric motor 104 and configured to control an operation of the electric motor 104. In some implementations, the controller 102 is a variable frequency drive (VFD) that can apply different frequency inputs to the electric motor 104. For example, the VFD has a 1 phase, 220 volt, 50/60 Hz input and 3 phase, 0-220 volt, 0-599 Hz output. The electric motor 104 is a 230/460 volt, 3 phase, 60 Hz motor with a variable operating speed up to 6000 or 7000 rpm (or greater). The electric motor 104 can rotate at multiple rotational speeds in response to the input from the controller 102. In some implementations, the controller 102 can be implemented as a pulse width modulated controller or other digital drive.

A rotational electric motor shaft of the electric motor 104 is coupled to a trip collar 110 through two hub assemblies—a first hub assembly 106 and a second hub assembly 108, which are described in detail later. The two hub assemblies couple the trip collar 110 to the electric motor shaft of the electric motor 104 such that the trip collar 110 trips when a rotational speed of the electric motor shaft is substantially equal to or greater than a rated trip speed of the trip collar 110, that is, a particular rotational speed at which the trip collar 110 is rated to trip. By "substantially equal," it is meant the actual rotational speed of the electric motor shaft and the rated trip speed need not be exactly equal. Instead, a variation of between 5-10% is permissible. An alarm 112 is spatially arranged relative to the trip collar 110. As described in detail later, the alarm 112 produces a signal in response to the trip collar 110 tripping. In some implementations, the system 100 includes a safety guard 114 (FIG. 1B), for example, a cage made of metal or other suitable material, that surrounds or encloses at least the trip collar 110, the two hub assemblies and the alarm 112. The safety guard 114 can retain any unsecured item thereby increasing safety when operating the system 100.

In one example operation, the rated trip speed of the trip collar 110 may be unknown. The trip collar 110 is coupled to the electric motor 104 as described earlier. The controller 102 operates the electric motor 104 to rotate at multiple, for example, increasing, rotational speeds. The trip collar 110 trips when a rotational speed of the electric motor shaft exceeds the rated trip speed. When the trip collar 110 trips, the alarm 112 produces an audible sound communicating that the trip collar 110 has tripped. In this manner, the rated trip speed of the trip collar 110 is determined. Knowing the rated trip speed of the trip collar 110 allows implementing the trip collar 110 as an over speed trip system in a machine, for example, an mechanical & electric machine such as a turbine, motor or generator, in which a maximum permissible rotational speed of a rotational shaft of the electric machine cannot exceed the determined rated trip speed.

In one example operations, the trip collar 110 may need to be calibrated. That is, the rated trip speed of the trip collar 110 may need to be increased or decreased. To do so, a desired trip speed for the trip collar 110 is determined. The trip collar 110 is coupled to the electric motor 104 as described earlier. The controller 102 operates the electric motor 104 to rotate at multiple, for example, increasing, rotational speeds. If the trip collar 110 trips at a rotational speed of the electric motor shaft that is less than the desired trip speed, then the trip collar 110 can be adjusted to increase its rated trip speed. Conversely, if the trip collar 110 trips at a rotational speed of the electric motor shaft that is more than the desired trip speed, then the trip collar 110 can be adjusted to decrease its rated trip speed. After each adjustment, the techniques described here can be re-performed until the trip collar 110 trips at the desired trip speed. In this manner, the trip collar 110 can be calibrated.

Figure 2:
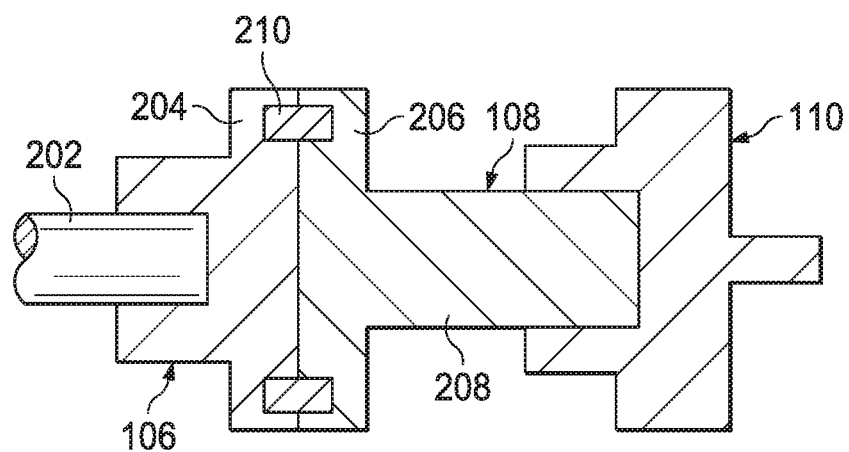
FIG. 2 is a schematic diagram of hub assemblies coupling a rotational electric motor shaft to the over speed trip collar of FIGS. 1A and 1B.

FIG. 2 is a schematic diagram of the two hub assemblies 106 and 108 coupling a rotational electric motor shaft to the over speed trip collar 110. An end of the rotational electric motor shaft 202 that extends from the electric motor 104 (FIGS. 1A, 1B) is rotationally coupled and secured to the first hub assembly 106. For example, the first hub assembly 106 includes a collar into which the end of the electric motor shaft 202 is received. An inner diameter of the collar and the outer diameter of the electric motor shaft 202 can be dimensioned to form a friction fit or tight fit with dowel pins that secures the end of the electric motor shaft 202 to the collar. Once coupled, the first hub assembly 106 rotates at the same rotational speed as the electric motor shaft 202.

The first hub assembly 106 is rotationally coupled and secured to a second hub assembly 108, for example, using a coupler 210 (example pin and bush coupling). Once coupled, the second hub assembly 108 rotates at the same rotational speed as the first hub assembly 106. The second hub assembly 108 includes a second hub 206 and a second rotational shaft 208 that extends away from the second hub 206. The second hub 206 and the second rotational shaft 208 can be integrally joined such that the second hub assembly 108 has a unitary body. Alternatively, the second rotational shaft 208 can be rotationally coupled and separably secured to the second hub 206. The second hub assembly 108 enables coupling any trip collar 110 to the motor shaft 202 regardless of the diameter of the trip collar 110. By selecting the second rotational shaft 208 to have a diameter that matches that of the trip collar 110, the same motor shaft 202 can be coupled to any trip collar 110 using the second hub assembly 108.

The second rotational shaft 208 is axially aligned with the electric motor shaft 202. That is, a rotational axis of both shafts is co-linear. An end of the second rotational shaft 208 is rotationally coupled and secured to the trip collar 110. Once coupled, the trip collar 110 rotates at the same speed as the second rotational shaft 208. In some implementations, the trip collar 110 can be rotationally coupled and secured directly to the electric motor shaft 202 without the two hub assemblies. In some implementations, a hub assembly (not shown) that a collar and a rotational shaft attached to the collar can be used instead of the two hub assemblies 106 and 108. In such implementations, the end of the electric motor shaft 202 can be rotationally coupled and secured to the collar and the end of the rotational shaft can be rotationally coupled and secured to the trip collar 110. In some implementations, the first hub assembly 106 can have the collar on one end as shown in FIG. 2 and can be configured to receive a rotational shaft on the other end. In such implementations, a rotational shaft can be coupled directly to the first hub 106 on one end and to the trip collar 110 on the other end. In sum, hub assembly configurations different from those described in this disclosure can be used to transfer the rotation of the electric motor shaft 202 to the trip collar 110.

Figure 3A:
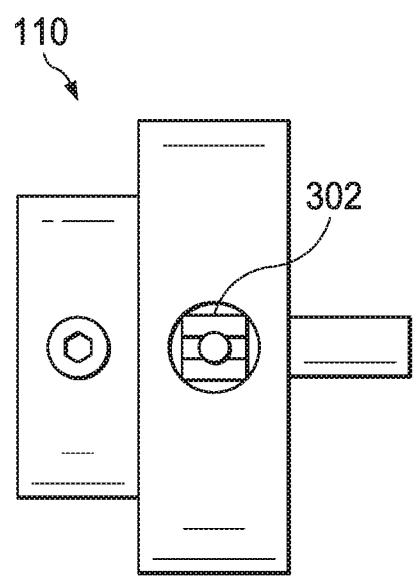
FIGS. 3A and 3B are schematic diagrams of the over speed trip collar of FIGS. 1A and 1B.
Figure 3B:
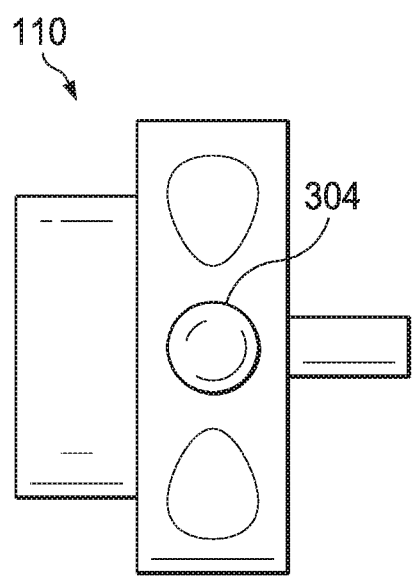

FIGS. 3A and 3B are schematic diagrams of the over speed trip collar 110. FIG. 3A shows an adjusting nut 302 formed in a circumferential surface of the trip collar 110. FIG. 3B shows a trigger pin 304 (sometimes called trip pin) positioned in the circumferential surface of the trip collar 110. The trigger pin 304 can be positioned diametrically opposite to the adjusting nut 302 and connected to each other with an intermediate trip spring and a lock (not shown). When the trip collar 110 rotates at or above the trip speed, the centrifugal force on the trip collar 110 causes the trigger pin 302 to extend radially away from the longitudinal axis of the trip collar 110 indicating a trip. Adjusting the adjusting nut 302 increases or decreases the tension on the trip spring, thereby modifying the centrifugal force at which the trigger pin 302 radially extends. And, changing the spring tension will change the trip speed.

Figure 4:
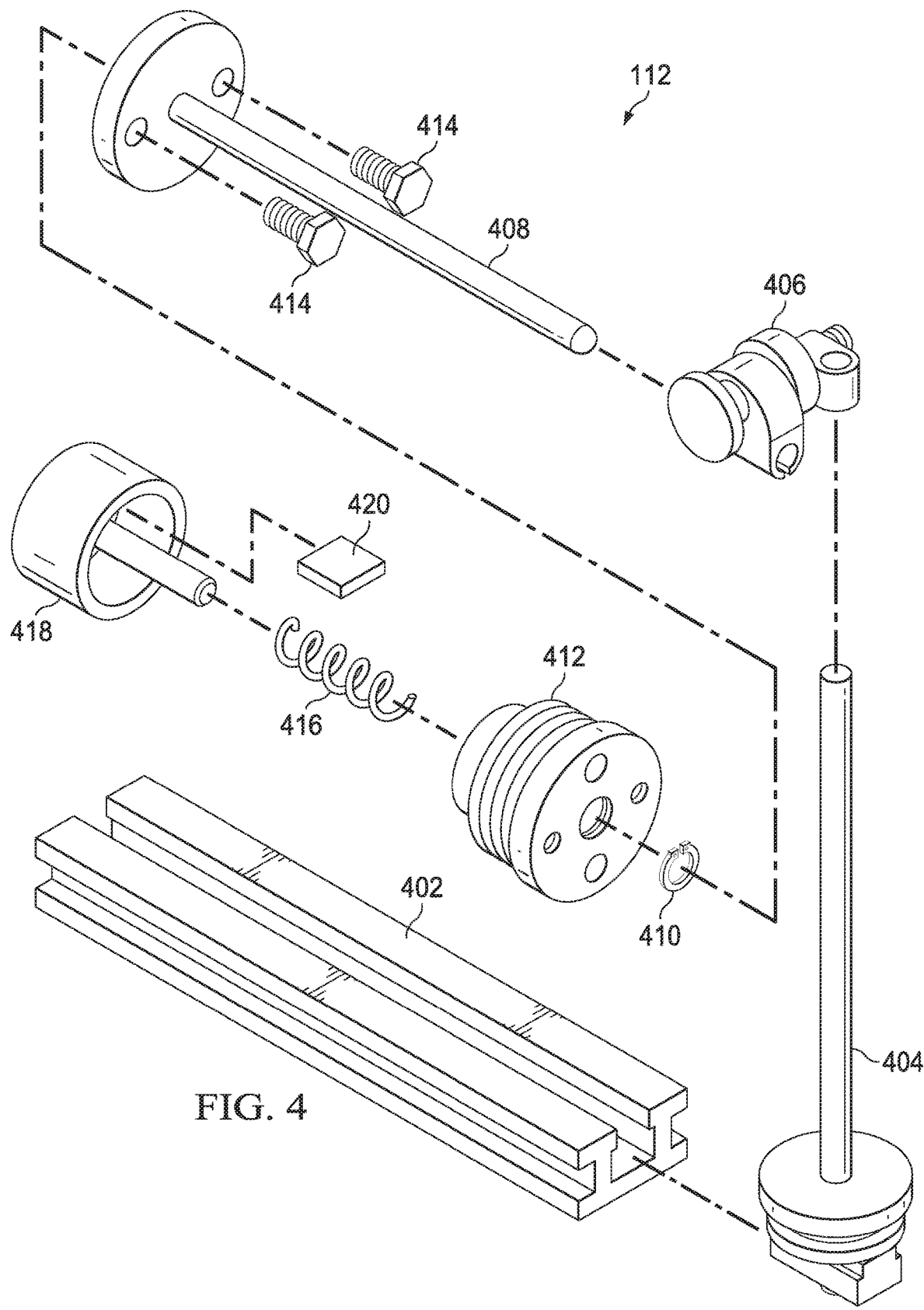
FIG. 4 is a schematic diagram showing components of an alarm of the over speed trip calibration system of FIGS. 1A and 1B.

FIG. 4 is a schematic diagram showing components of an alarm 112 of the over speed trip calibration system 100. As described earlier, the alarm 112 is spatially arranged relative to the trip collar 110 and is triggered when the trip collar 110 trips. In some implementations, the trigger pin 304 extends radially, as described earlier, when the trip collar 110 trips. The extended trigger pin 304 contacts a component of the alarm 112 to produce an audible signal that indicates that the trip collar 110 has tripped.

In some implementations, the alarm 112 includes a sliding base 402 that rests on a surface and supports remaining components of the alarm 112. The alarm 112 includes a vertical rod 404 having an end coupled to the sliding base 402. The body of the sliding base 402 defines a slot or a groove in which the end of the vertical rod 404 can be positioned. The end can be moved and secured to any position within the slot or the groove, thereby allowing the vertical rod 404 to be coupled to the sliding base 402 at a desired position. The alarm 112 includes a horizontal rod 408 having an end that can be coupled to the vertical rod 404 via a connector 406. The connector 406 is a horizontal-to-vertical connector with screws or other clamping mechanisms that can secure to the vertical rod 404 and the horizontal rod 408. Loosening the connector 406 allows modifying the location of the connector 406 on the vertical rod 404 or the horizontal rod 408.

The alarm 112 includes a plunger 418 which is the component that the trigger pin 304 contacts upon extending radially away from the rotational axis of the electric motor shaft 202. In some implementations, the alarm 112 can include a spring 416 coupled to the plunger 418. When the trigger pin 304 contacts the plunger 418, the spring 416 compresses allowing the plunger 418 to move radially away from the rotational axis of the electric motor shaft 202. The spring 416 then expands allowing the plunger 418 to return to its original position. The alarm 112 includes a plunger nut 412 to connect the plunger 418 to the horizontal rod 408, and connecting bolts 414 to secure the connection between the plunger 418 and the horizontal rod 408. In some implementations, the alarm 112 includes a retaining ring 410 to connect the plunger 418 to the plunger nut 412 and to put the spring 416 under tension.

In operation, an end surface of the plunger 418 is positioned adjacent the trigger pin 304 of the trip collar 110. As the electric motor shaft 202 rotates responsive to input from the controller 102, the first hub assembly 106 and the second hub assembly 108 transfer the rotation of the electric motor shaft 202 to the trip collar 110. When the rotational speed input from the controller 102 reaches or exceeds the trip speed of the trip collar 110, the trigger pin 304 extends radially away from the rotational axis of the electric motor shaft 202. The extended trigger pin 304 contacts the end surface of the plunger 418 producing an audible sound.

In some implementations, a displacement sensor 420 can be implemented in place of the plunger 418. For example, the displacement sensor 420 can be positioned adjacent to and a pre-determined distance from the trigger pin 304. The displacement sensor 420 is configured to sense a transmit a signal, for example, to a computer system (not shown), if the distance between the trigger pin 304 and the displacement sensor 420 changes from the pre-determined distance. In operation, when the trip collar 110 trips, the trigger pin 304 moves relative to, for example, towards, the displacement sensor 420, thereby changing the pre-determined distance. In response, the displacement sensor 420 transmits the signal indicating that the trip collar 110 has tripped.

Figure 5:
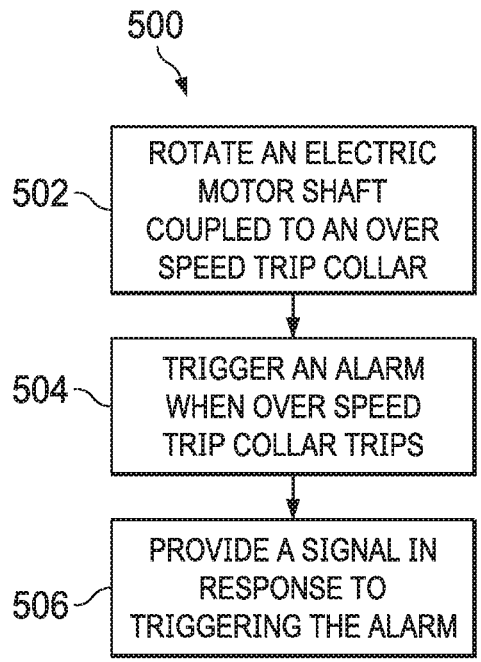
FIG. 5 is a flowchart of an example of a process implemented by the over speed trip calibration system.

FIG. 5 is a flowchart of an example of a process 500 implemented by the over speed trip calibration system 100. The steps of the process 500 can be implemented by one or more components of the system 100. At 502, an electric motor shaft coupled to an over speed trip collar is rotated. For example, the controller 102 rotates the electric motor shaft 202 coupled to the over speed trip collar 110. At 504, an alarm is triggered when the over speed trip collar trips. For example, when the controller 102 rotates the electric motor shaft 202 at a rotational speed greater than the rated trip speed for the trip collar 110, the trigger pin 304 extends contacting the plunger 418, thereby triggering the alarm indicating the trip. At 506, a signal is provided in response to triggering the alarm. For example, the contact between the trigger pin 304 and the plunger 418 produces an audible signal indicating that the alarm has been triggered.

Figure 6:
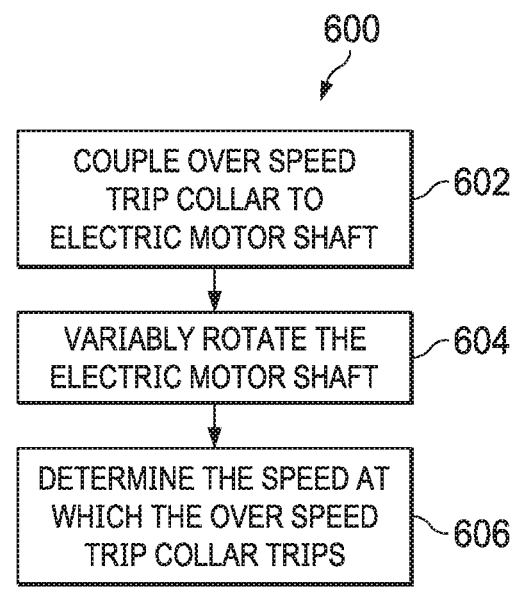
FIG. 6 is a flowchart of an example of a process of using the over speed trip calibration system.

FIG. 6 is a flowchart of an example of a process 600 of using the over speed trip calibration system. The steps of the process 600 can be implemented by a user of the system 100 both to determine and to calibrate the trip speed of a trip collar, for example, the trip collar 110. At 602, the trip collar 110 is coupled to the electric motor shaft 202. At 604, the electric motor shaft is rotated at variable rotational speeds by operating the controller 102. At 606, the rotational speed at which the trip collar 110 trips is determined. The determined rotational speed is the rated trip speed of the trip collar 110. In some implementations, the trip collar 110 can be adjusted to modify the rated trip speed. The adjusted trip collar can be coupled to the electric motor shaft 202 and the process 600 can be performed. The rotational speed at which the adjusted trip collar trips is the modified rated trip speed of the trip collar.

Thus, particular implementations of the subject matter have been described. Other implementations are within the scope of the following claims.

The invention claimed is:
1. A method comprising:
rotationally coupling an over speed trip collar of a rotational shaft of an electric machine to a rotational electric motor shaft, the over speed trip collar configured to trip in response to the rotational shaft of the electric machine being rotated at a particular rotational speed, wherein rotationally coupling the over speed trip collar to the rotational electric motor shaft comprises:
rotationally coupling an end of the rotational electric motor shaft to a first hub assembly;
rotationally coupling the first hub assembly to a second hub assembly; and
rotationally coupling an end of the second hub assembly to the over speed trip collar;
variably rotating the rotational electric motor shaft at a plurality of rotational speeds;
determining that the over speed trip collar trips at a rotational speed of the plurality of rotational speeds; and
determining the rotational speed of the plurality of rotational speeds at which the over speed trip collar trips as the particular rotational speed at which the over speed trip collar is configured to trip when implemented with the rotational shaft of the electric machine.
2. The method of claim 1, wherein the second hub assembly comprises a rotational shaft of the second hub assembly, wherein rotationally coupling the end of the second hub assembly to the over speed trip collar comprises rotationally coupling an end of the rotational shaft of the second hub assembly to the over speed trip collar.

3. The method of claim 2, wherein rotationally coupling the end of the rotational shaft of the second hub assembly to the over speed trip collar comprises inserting the end of the rotational shaft of the second hub assembly into the over speed trip collar.

4. The method of claim 1, the rotational electric motor shaft is variably rotated using a variable frequency drive (VFD) coupled to and configured to operate the rotational electric motor shaft.

5. The method of claim 1, wherein the over speed trip collar comprises a trigger pin configured to extend radially away from a rotational axis of the rotational electric motor shaft in response to the rotational electric motor shaft rotating at the particular rotational speed, wherein determining the rotational speed of the plurality of rotational speeds at which the over speed trip collar trips comprises:
  spatially positioning an alarm relative to the trigger pin, the trigger pin configured to trigger the alarm in response to the trigger pin extending radially away from the rotational axis of the rotational electric motor shaft; and
  detecting the alarm being triggered.

6. The method of claim 5, wherein the trigger pin is configured to contact the alarm in response to extending radially away from the rotational axis of the rotational shaft of the electric machine, wherein detecting the alarm being triggered comprises detecting an audible sound emitted by the alarm in response to being contacted by the trigger pin.

7. The method of claim 1, further comprising, in response to determining the rotational speed of the plurality of rotational speeds, modifying the particular rotational speed at which the over speed trip collar is configured to trip by modifying one or more structural parameters of the over speed trip collar.

8. The method of claim 1, wherein the over speed trip collar is detached from the electric machine before rotationally coupling the over speed trip collar of the rotational shaft of the electric machine to the rotational electric motor shaft.

9. The method of claim 1, wherein the electric machine is a turbine.

10. A method comprising:
  rotating, by an electric motor and at a plurality of rotational speeds, a rotational electric motor shaft coupled to an over speed trip collar of a rotational shaft of an electric machine, the over speed trip collar configured to trip in response to the rotational electric motor shaft being rotated at a particular rotational speed;
  triggering, by the over speed trip collar, an alarm when a rotational speed of the plurality of rotational speed substantially matches the particular rotational speed; and
  providing, by the alarm, a signal in response to triggering the alarm.

11. The method of claim 10, wherein the alarm is spatially positioned relative to the over speed trip collar to be contacted by a trigger pin of the trip collar in response to the over speed trip collar tripping, wherein triggering, by the over speed trip collar, the alarm comprises contacting, by the trigger pin, a plunger of the alarm.

12. The method of claim 11, wherein the signal is an audible signal generated in response to the trigger pin contacting the plunger of the alarm.

13. The method of claim 10, wherein the alarm comprises a displacement sensor configured to sense a distance between the trigger pin and the displacement sensor, wherein the method further comprises determining, by the displacement sensor, that a distance between the trigger pin and the displacement sensor is less than a distance threshold.

14. The method of claim 13, wherein the signal is an audible signal generated by an audio source connected to the displacement sensor in response to determining that the distance is less than the distance threshold.

15. The method of claim 10, wherein the over speed trip collar is detached from the electric machine before rotationally coupling the over speed trip collar of the rotational shaft of the electric machine to the rotational electric motor shaft.

16. The method of claim 10, wherein the electric machine is a turbine.

17. An overtrip calibration system comprising:
  an electric motor comprising a rotational electric motor shaft configured to rotationally couple to an over speed trip collar of a rotational shaft of a turbine, the over speed trip collar configured to trip in response to being rotated at or above a particular rotational speed;
  a first hub assembly configured to be coupled to the trip collar;
  a second hub assembly coupled to the first hub assembly, wherein the second hub assembly is coupled to the rotational electric motor shaft;
  a controller coupled to the rotational electric motor shaft, the controller configured to variably rotate the rotational electric motor shaft at a plurality of rotational speeds including at or above the particular rotational speed; and
  an alarm spatially arranged relative to the over speed trip collar, the alarm configured to produce a signal in response to the over speed trip collar tripping.

18. The system of claim 17, wherein the controller comprises a variable frequency drive.

19. The system of claim 17, wherein the over speed trip collar comprises a trigger pin configured to extend radially away from a rotational axis of the rotational electric motor shaft in response to the over speed trip collar tripping, wherein the signal is an audible signal, wherein the alarm is configured to produce the audible signal in response to the trigger pin extending radially away from the rotational axis of the rotational electric motor shaft and contacting the alarm,
  wherein the system further comprises an adjusting nut formed in a circumferential surface of the trip collar, wherein the trigger pin is positioned diametrically opposite to the adjusting nut, wherein the adjusting nut is configured to be adjusted to modify a centrifugal force at which the trigger pin extends radially away from the rotational axis of the rotational electric motor shaft.

20. The system of claim 17, further comprising a safety guard comprising a metal cage enclosing the trip collar, the first hub assembly, the second assembly and the alarm.

* * * * *